(12) United States Patent
Yang et al.

(10) Patent No.: US 12,096,580 B2
(45) Date of Patent: Sep. 17, 2024

(54) WATERPROOF ELECTRONIC DEVICE

(71) Applicant: Honor Device Co., Ltd., Shenzhen (CN)

(72) Inventors: Xiujuan Yang, Shenzhen (CN); Wenhao Wang, Shenzhen (CN); Mingchuan Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/912,685

(22) PCT Filed: Jan. 5, 2022

(86) PCT No.: PCT/CN2022/070359
§ 371 (c)(1),
(2) Date: Sep. 19, 2022

(87) PCT Pub. No.: WO2022/252616
PCT Pub. Date: Dec. 8, 2022

(65) Prior Publication Data
US 2024/0215191 A1    Jun. 27, 2024

(30) Foreign Application Priority Data
Jun. 3, 2021    (CN) .......................... 202110621202.8

(51) Int. Cl.
*H05K 5/06*    (2006.01)
*H04R 1/10*    (2006.01)
(Continued)

(52) U.S. Cl.
CPC ............. *H05K 5/06* (2013.01); *H04R 1/1016* (2013.01); *H04R 1/1075* (2013.01); *H05K 5/0026* (2013.01); *H05K 5/0226* (2013.01)

(58) Field of Classification Search
CPC ........... H05K 5/06–069; H05K 5/0026; H05K 5/0226; H04R 1/1016; H04R 1/1075
See application file for complete search history.

(56) References Cited

U.S. PATENT DOCUMENTS 5,504,502 A * 4/1996 Arita ................. G06F 1/1616
                                                345/905
7,942,678 B2   5/2011 Sanford et al.
(Continued)

FOREIGN PATENT DOCUMENTS

CN    201478543 U    5/2010
CN    203984830 U    12/2014
(Continued)

*Primary Examiner* — Jacob R Crum
(74) *Attorney, Agent, or Firm* — Rimon PC

(57) ABSTRACT

A waterproof electronic device includes a shell, a first electronic module, a second electronic module, and a flexible printed circuit FPC. A first compartment and a second compartment which are in communication with each other through a through hole are formed in the shell. The through hole is used for the FPC to pass through. The first and second electronic module are arranged in the first and second compartment respectively. The first electronic module is coupled to the second electronic module by the FPC which passes through the through hole. An opening in communication with the through hole is provided on the shell. A magnetic colloidal structure is arranged in the through hole, where the magnetic colloidal structure seals the through hole.

10 Claims, 6 Drawing Sheets

(51) Int. Cl.
*H05K 5/00* (2006.01)
*H05K 5/02* (2006.01)

(56) References Cited

U.S. PATENT DOCUMENTS

| | | | |
|---|---|---|---|
| 8,149,575 B2* | 4/2012 | Yang | ........................ H05K 5/06 |
| | | | 361/679.56 |
| 11,245,782 B2 | 2/2022 | Hong | |
| 2003/0095390 A1 | 5/2003 | Kim et al. | |
| 2012/0224710 A1 | 9/2012 | Terlizzi et al. | |
| 2016/0316287 A1* | 10/2016 | Li | .......................... H04R 1/025 |
| 2017/0139442 A1* | 5/2017 | Yoshizumi | ........... G04G 17/045 |
| 2020/0162596 A1 | 5/2020 | Kim et al. | |
| 2021/0265592 A1 | 8/2021 | Xu et al. | |
| 2022/0291720 A1 | 9/2022 | Luo et al. | |

FOREIGN PATENT DOCUMENTS

| | | |
|---|---|---|
| CN | 205230541 U | 5/2016 |
| CN | 106375523 A | 2/2017 |
| CN | 205918332 U | 2/2017 |
| CN | 107880819 A | 4/2018 |
| CN | 207252092 U | 4/2018 |
| CN | 207603744 U | 7/2018 |
| CN | 109780219 A | 5/2019 |
| CN | 109860257 A | 6/2019 |
| CN | 110069104 A | 7/2019 |
| CN | 210075825 U | 2/2020 |
| CN | 212874880 U | 4/2021 |
| CN | 112866447 A | 5/2021 |
| JP | 2014036197 A | 2/2014 |
| TW | 201001460 A | 1/2010 |
| TW | 201333353 A | 8/2013 |
| WO | 2020130732 A1 | 6/2020 |

\* cited by examiner

WATERPROOF ELECTRONIC DEVICE

CROSS-REFERENCE TO RELATED APPLICATIONS

This application is a US National Stage Application of International Application No. PCT/CN2022/070359, filed Jan. 5, 2022, which claims priority to Chinese Patent Application No. 202110621202.8, filed Jun. 3, 2021, both of which are hereby incorporated by reference in their entireties.

TECHNICAL FIELD

This application relates to the field of terminal technologies, and in particular, to a waterproof electronic device.

BACKGROUND

There are electronic components located in different spatial positions in electronic devices. Due to the flexible property of a flexible printed circuit (flex print circuit, FPC), in an electronic device, the FPC is usually configured to connect electronic components located in different spatial positions, and in particular, electronic components of which spatial positions are not at the same horizontal position or are not always at the same horizontal position. For example, spatial positions in which electronic components in two screen regions of a foldable mobile phone are located change with a process that the foldable mobile phone is folded or unfolded, and therefore, are not always at the same horizontal position.

Obviously, when an electronic device includes an external liquid inlet, it is easy for external liquid intruding into the electronic device from the liquid inlet to intrude through a through hole into spatial positions in which electronic components is located, to damage the electronic component and further damage the electronic device.

SUMMARY

This application provides a waterproof electronic device, configured to resolve a problem that liquid easily intrudes into an electronic device and causes damage to the electronic device.

To achieve the foregoing objective, the following technical solutions are used in this application:

This application provides a waterproof electronic device. The waterproof electronic device includes a shell, a first electronic module, a second electronic module, and a flexible printed circuit FPC. A first compartment and a second compartment are formed in the shell. The first compartment and the second compartment are in communication with each other through a through hole, and the through hole is used for the FPC to pass through. The first electronic module is arranged in the first compartment, and the second electronic module is arranged in the second compartment. The first electronic module is coupled to the second electronic module by using the FPC passing through the through hole, to implement signal transmission between the first electronic module and the second electronic module. An opening is provided on the shell, where the opening is in communication with the through hole. A magnetic colloidal structure is arranged in the through hole, where the magnetic colloidal structure matches the through hole.

In the waterproof electronic device, the magnetic colloidal structure can be attracted into the through hole by using its own magnetic property, to be fixedly connected to the through hole. Because the magnetic colloidal structure matches the through hole in shape and size, the magnetic colloidal structure can seal the through hole, thereby blocking a liquid intrusion path between the first compartment and the second compartment. In this way, it is difficult for external liquid intruding into an interior of the electronic device through the opening to intrude into the first compartment and/or the second compartment, thereby reducing a risk that liquid intrudes into the electronic device, avoiding damage to a screen and an internal electronic component, and further improving reliability of the electronic device.

Optionally, the magnetic colloidal structure is fixedly sleeved on the FPC. When the FPC passes through the through hole to be respectively coupled to the first electronic module and the second electronic module, the magnetic colloidal structure is located in the through hole. Because the magnetic colloidal structure is fixedly sleeved on the FPC, the magnetic colloidal structure and the FPC can form a tight and seamless connection relationship, which can achieve a better sealing effect. In addition, by such configuration, during assembling the FPC, the magnetic colloidal structure is directly brought into the through hole, and there is no need to separately mount the magnetic colloidal structure, making the mounting process simpler.

In a possible design, the waterproof electronic device is a foldable electronic device. The foldable electronic device further includes a rotary shaft component. The shell includes a first shell component and a second shell component. The first shell component and the second shell component are respectively connected to the rotary shaft component, and the first shell component and the second shell component rotate under the driving of the rotary shaft component, causing the foldable electronic device to be folded or unfolded. The first compartment is formed in the first shell component, and the second compartment is formed in the second shell component. A movable region is formed between the first shell component and the second shell component, and the movable region is located between the first compartment and the second compartment when the foldable electronic device is in an unfolded state. The rotary shaft component and the FPC are arranged in the movable region. The through hole includes a first through hole running through the movable region and the first compartment, and a second through hole running through the movable region and the second compartment. A first end of the FPC passes through the first through hole to be coupled to the first electronic module, and a second end of the FPC passes through the second through hole to be coupled to the second electronic module. The matching magnetic colloidal structures is arranged in both the first through hole and the second through hole.

In the foldable electronic device, the magnetic colloidal structure can be attracted into the first through hole and the second through hole by using its own magnetic property, to be fixedly connected to the first through hole and the second through hole. Because the magnetic colloidal structure matches the first through hole and the second through hole in shape and size, the magnetic colloidal structure can seal the first through hole and the second through hole, thereby blocking liquid intrusion paths from the movable region to the first compartment and the second compartment respectively. In this way, it is difficult for external liquid intruding into the movable region through the opening to intrude into the first compartment and the second compartment, thereby reducing a risk that liquid intrudes into the foldable electronic device, and avoiding damage to a screen and an internal electronic component.

Optionally, the foldable electronic device further includes a first support plate, a second support plate, and a foldable screen. The foldable screen is foldable to form a first screen and a second screen. The first support plate is configured to carry the first screen, and the second support plate is configured to carry the second screen. The first shell component includes a first side wall configured to support the first support plate. The second shell component includes a second side wall configured to support the second support plate. The first side wall divides an interior of the first shell component into the first compartment and a first movable region. The second side wall divides the second shell component into the second compartment and a second movable region. The first movable region and the second movable region are located within the movable region.

Further, a support end of the first side wall is connected to the first support plate, and the first through hole is formed between the support end of the first side wall and the first support plate. A support end of the second side wall is connected to the second support plate, and the second through hole is formed between the support end of the second side wall and the second support plate. In this example, when the first shell component is assembled, a specific space can be maintained between the support end of the first side wall and the first support plate, to obtain the first through hole, and the second through hole can be obtained in the same mode. In this way, a process step of opening the first through hole can be omitted.

Still further, the support end of the first side wall and the support end of the second side wall are both provided with a groove, and the magnetic colloidal structure is embedded into the groove. When the magnetic colloidal structure is located in the groove, the groove and the magnetic colloidal structure are magnetically attracted to each other more closely on three surfaces of the groove, and the groove can tightly wrap and lock the magnetic colloidal structure, so that tighter contact and sealing can be formed.

Optionally, when the foldable electronic device is in the unfolded state, the opening is a gap formed by the shell between the first shell component and the second shell component.

In another possible design, the waterproof electronic device is an earphone. The shell includes an earphone head shell and an earphone stem shell. The first compartment is formed in the earphone head shell. The second compartment is formed in the earphone stem shell. The first electronic module is configured to implement audio output. The second electronic module is configured to supply power to the first electronic module by using the FPC passing through the through hole.

In the earphone, the magnetic colloidal structure can be fixedly connected into the through hole by using its own magnetic property, to seal the through hole, thereby blocking a liquid intrusion path between the first compartment and the second compartment. In this way, it is difficult for external liquid intrude into the first compartment through the opening to intrude into the second compartment and cause damage to the second electronic module, thereby further reducing a risk of damage to the earphone.

Optionally, the opening is a sound outlet hole on the earphone head shell.

Optionally, in the waterproof electronic device, the magnetic colloidal structure includes any one of a magnetic rubber, a magnetic epoxy glue, or a magnetic acrylic glue.

DESCRIPTION OF EMBODIMENTS

The terms "first" and "second" mentioned below are merely intended for a purpose of description, and shall not be understood as an indication or implication of relative importance or implicit indication of the quantity of indicated technical features. Therefore, a feature defined by "first" or "second" can explicitly or implicitly includes one or more features. In the description of the embodiments, unless otherwise stated, "a plurality of" means two or more.

The following describes implementations of the embodiments in detail with reference to the accompanying drawings.

There are electronic components located in different spatial positions in electronic devices. Due to the flexible property of a flexible printed circuit (flex print circuit, FPC), in an electronic device, the FPC is usually configured to connect electronic components located in different spatial positions, and in particular, electronic components of which spatial positions are not at the same horizontal position or are not always at the same horizontal position. For example, spatial positions in which electronic components in two screen regions of a foldable mobile phone are located change with a process that the foldable mobile phone is folded or unfolded, and therefore, are not always at the same horizontal position. Obviously, when an electronic device includes an external liquid inlet, it is easy for external liquid intruding into the electronic device from the liquid inlet to intrude through a through hole into spatial positions in which electronic components is located, to damage the electronic component and further damage the electronic device.

A liquid intrusion process of external liquid is described below in detail using a scenario in which the electronic device is a foldable electronic device.

Figure 1:
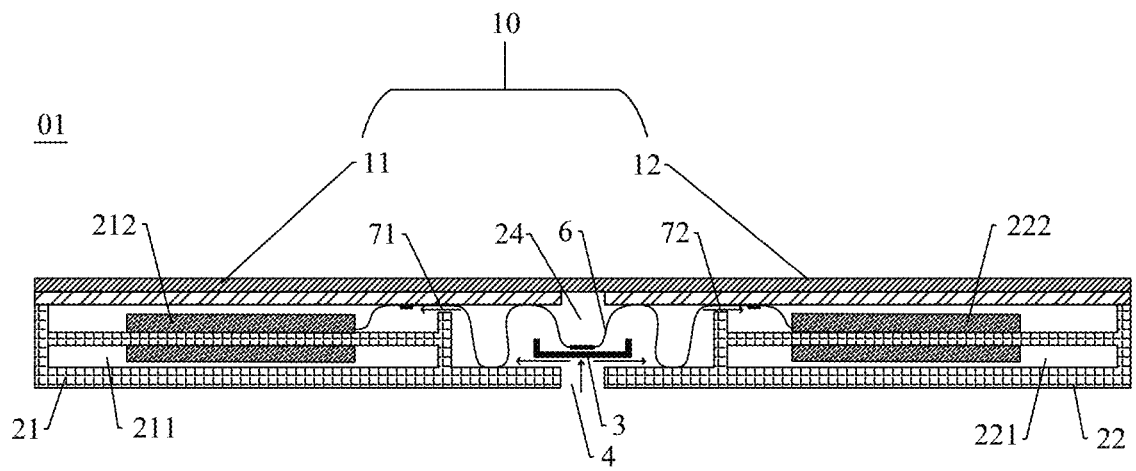
FIG. 1 is a schematic diagram of an internal structure of a foldable electronic device in an unfolded state.

Exemplarily, FIG. 1 is a schematic diagram of an internal structure of a foldable electronic device in an unfolded state.

As shown in FIG. 1, using a mobile phone as an example, a foldable electronic device 01 includes a foldable screen 10. The foldable screen 10 is foldable to form a first screen 11 and a second screen 12.

To implement a folding function of the foldable electronic device 01, the foldable electronic device 01 further includes a first shell component 21, a second shell component 22, and a rotary shaft component 3. The first shell component 21 and the second shell component 22 may be middle frame structures of the foldable electronic device 01. The first shell component 21 and the second shell component 22 are respectively connected to the rotary shaft component 3, and the first shell component 21 and the second shell component 22 can rotate under the driving of the rotary shaft component 3, thereby driving the foldable screen 10 to be folded or unfolded.

Referring to FIG. 1, the first compartment 211 is formed in the first shell component 21, and the second compartment 221 is formed in the second shell component 22. A first electronic module 212 configured to implement a signal processing function is arranged in the first compartment 211, and a second electronic module 222 configured to implement a signal processing function is arranged in the second compartment 221.

To implement signal transmission between the first electronic module 212 and the second electronic module 222, an FPC 6 is arranged in a movable region 24 of the foldable electronic device 01. One end of the FPC 6 passes through a first through hole 71, to be coupled to the first electronic module 212 located in the first compartment 211, and an other end of the FPC 6 passes through a second through hole 72, to be coupled to the second electronic module 222 located in the second compartment 221, thereby implementing signal transmission between the first electronic module 212 and the second electronic module 222.

To avoid interfering with opening and closing (folding or unfolding process) of the foldable electronic device 01, in an unfolded state shown in FIG. 1, a gap 4 is further provided between the first shell component and the second shell component. The gap 4 becomes larger when the foldable electronic device 01 is folded, and becomes smaller when the foldable electronic device 01 is unfolded, thereby leaving a sufficient movement margin for components in the movable region, such as the FPC and the rotary shaft component 3, to ensure smooth opening and closing of the foldable electronic device 01.

However, the gap 4 becomes an opening for an external liquid to intrude into the foldable electronic device 01 and cause damage to an internal electronic component. Specifically, the existence of the gap 4 allows the foldable electronic device 01 to include an opening in communication with through holes (the first through hole 71 and the second through hole 72 as shown in FIG. 1), and therefore, a liquid intrusion path indicated by a dotted line with an arrow in FIG. 1 is provided in an interior of the foldable electronic device 01 to for the external liquid. As shown in FIG. 1, the external liquid easily intrudes into the movable region 24 through the opening, and then intrudes into the first compartment 211 and the second compartment 221 respectively through the through holes, which causes damage to a screen and a short circuit of the internal electronic component, and further affects user experience.

Figure 2:
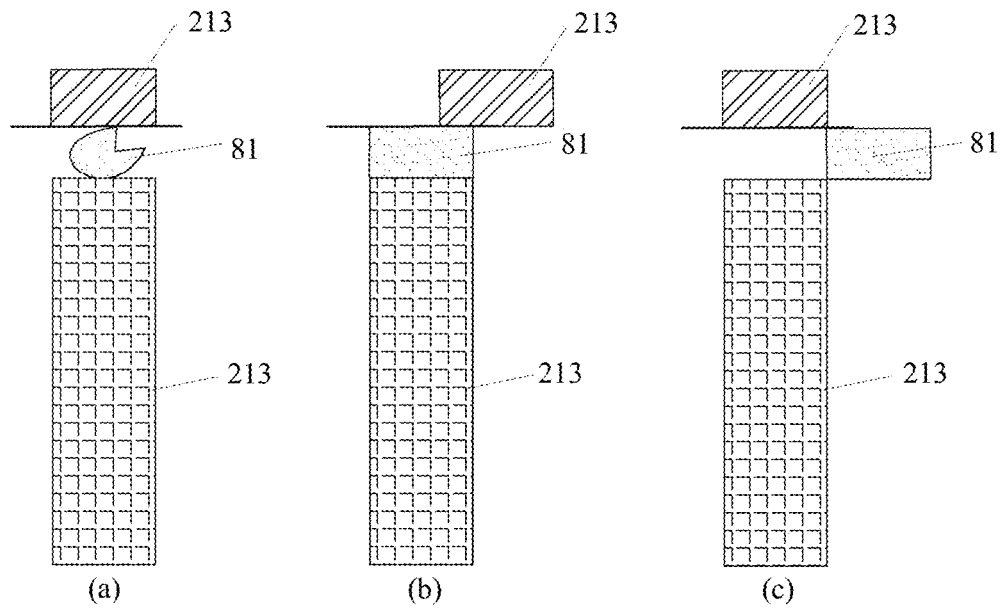
FIG. 2 is a schematic structural diagram of preventing liquid from intruding into a through hole in the prior art.

In the prior art, a sealing ring or sealing foam 81 is usually filled at the through hole (for example, a first through hole 213) shown in FIG. 1 to block the liquid intrusion path of the external liquid. However, because a size of the through hole is small, and a mounting surface of the through hole for mounting the sealing ring or the sealing foam 81 is not exposed, there are problems such as narrow operation space, very difficult mounting, and difficult operation. In an assembling process, because it is difficult to mount the sealing ring or the sealing foam 81 in place at a time, and the sealing ring or the sealing foam 81 is relatively soft, the problem of wrinkling shown in (a) in FIG. 2 is prone to occur during assembly. In addition, because the sealing ring or the sealing foam 81 is bonded into the through hole by viscosity, during the assembly, once the sealing ring or the sealing foam 81 is not bonded in place (for example, an offset shown in (b) in FIG. 2 or a deviation shown in (c) in FIG. 2), it is difficult to peel off and re-fix the sealing ring or the sealing foam 81, resulting in an offset or deviation problem after assembly. Consequently, the electronic device still has a risk of liquid intrusion.

To resolve the foregoing technical problem that liquid is likely to intrude into the gap 4 on the foldable electronic device 01, resulting in damage to the foldable electronic device 01, this application provides a waterproof electronic device. The waterproof electronic device provided in the embodiments of this application is described in detail below with reference to FIG. 3 to FIG. 8.

Figure 3:
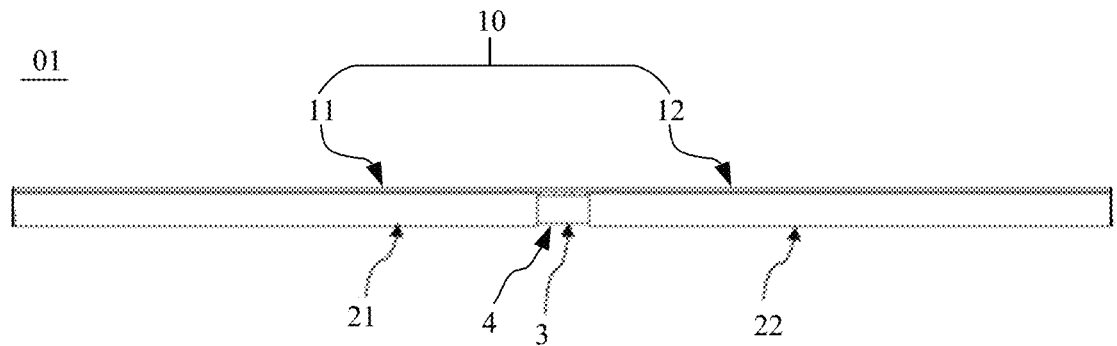
FIG. 3 is a schematic structural diagram of a foldable electronic device in an unfolded state according to an embodiment of this application.

Exemplarily, FIG. 3 is a schematic structural diagram of a foldable electronic device in an unfolded state according to an embodiment of this application. The foldable electronic device is an electronic device of which a foldable screen can be folded. The foldable electronic device may be a product with a display interface, such as a mobile phone, a monitor, a tablet computer, an in-vehicle computer, or the like. A specific form of the foregoing foldable electronic device is not specifically limited in the embodiments of this application.

As shown in FIG. 3, using a mobile phone as an example, a foldable electronic device 01 includes a foldable screen 10.

The foldable screen 10 is foldable to form a first screen 11 and a second screen 12. The two screens formed after the foldable screen 10 is folded may be two screens that independently exist. The foldable screen 10 may also be a complete screen with an integrated structure, which, however, is folded to form two screens, for example, a flexible foldable screen.

In the following examples, descriptions are all provided by using an example in which the foldable screen is an integrally formed flexible display screen.

The flexible foldable screen includes a folding edge made of a flexible material. The foldable screen 10 can be folded along the folding edge to form a first screen 11 and a second screen 12. The flexible foldable screen is partially or entirely made of a flexible material. For example, only a foldable part (such as the folding edge) of the flexible foldable screen is made of the flexible material, and the remaining parts are made of a rigid material. Alternatively, the flexible foldable screen is entirely made of the flexible material.

Exemplarily, the flexible display screen may be an active matrix organic light emitting diode (active matrix organic light emitting diode, AMOLED) display screen. As a self-illuminating display screen, the AMOLED display screen does not need to have a back light module (back light module, BLM) arranged. Therefore, when a substrate in the AMOLED display screen is made of a flexible resin material, such as polyethylene terephthalate (polyethylene terephthalate, PET), the foregoing AMOLED display screen can have a property of being bendable.

To implement a folding function of the foldable electronic device 01, the foldable electronic device 01 further includes a first shell component 21, a second shell component 22, and a rotary shaft component 3. The first shell component 21 and the second shell component 22 may be middle frame structures of the foldable electronic device 01. The first shell component 21 and the second shell component 22 are respectively connected to the rotary shaft component 3, and the first shell component 21 and the second shell component 22 can rotate under the driving of the rotary shaft component 3, thereby driving the foldable screen 10 to be folded or unfolded.

Figure 4:
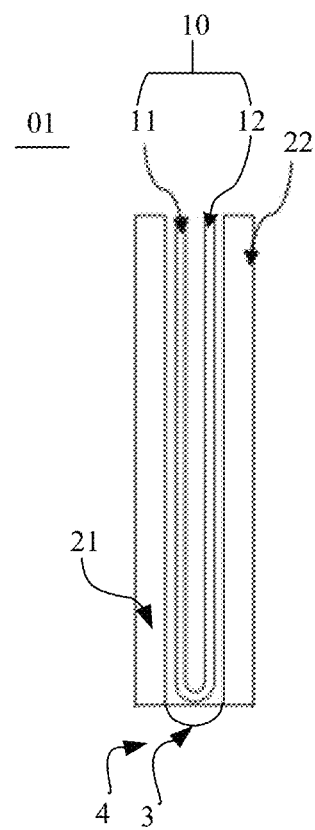
FIG. 4 is a schematic structural diagram of a foldable electronic device in a folded state according to an embodiment of this application.

As shown in FIG. 3, when an included angle between the first shell component 21 and the second shell component 22 is 180 degrees, the foldable screen 10 is in an unfolded state, and the first screen 11 and the second screen 12 are located at two sides of the rotary shaft component 3. Alternatively, as shown in FIG. 4, when the first shell component 21 and the second shell component 22 are stacked together, the foldable screen 10 is in a folded state, and the first screen 11 and the second screen 12 are stacked on the same side of the rotary shaft component 3.

In the unfolded state shown in FIG. 3, the foldable electronic device 01 is formed with a gap 4 between the first shell component 21 and the second shell component 22, and the gap 4 is configured to ensure a sufficient movement margin between the first shell component 21 and the second shell component 22, to avoid interfering with opening and closing of the foldable electronic device 01. Referring to FIG. 3 and FIG. 4, the gap 4 becomes larger as the foldable electronic device 01 is folded into the folded state of FIG. 4, and becomes smaller as the foldable electronic device 01 is folded into the unfolded state of FIG. 3, thereby ensuring that the foldable electronic device 01 can be smoothly opened and closed.

The technical solution of how to prevent liquid intrusion is described below in detail with reference to an internal structure of the foldable electronic device 01.

Figure 5:
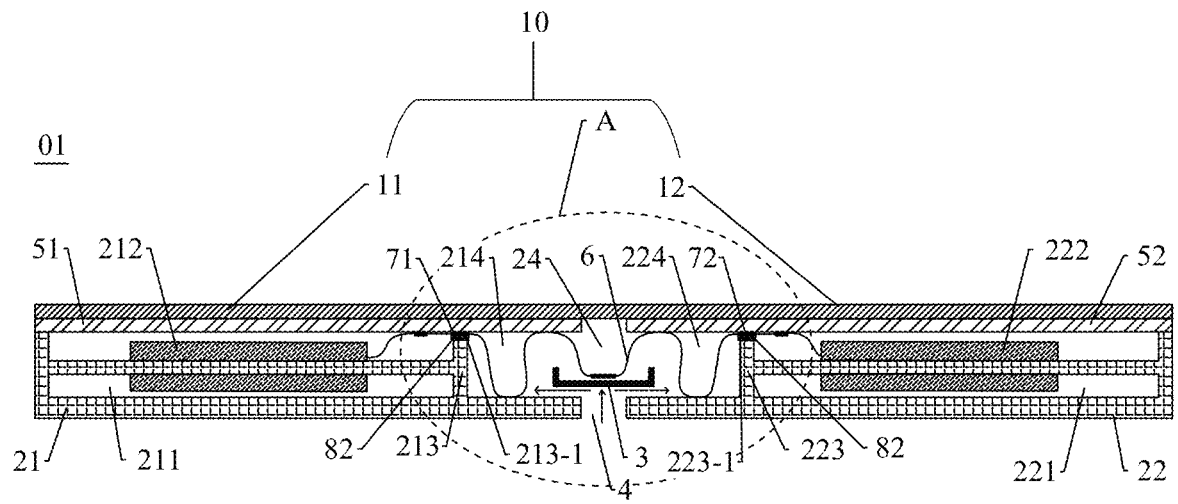
FIG. 5 is a cross-sectional view of the foldable electronic device shown in FIG. 3.
Figure 6:
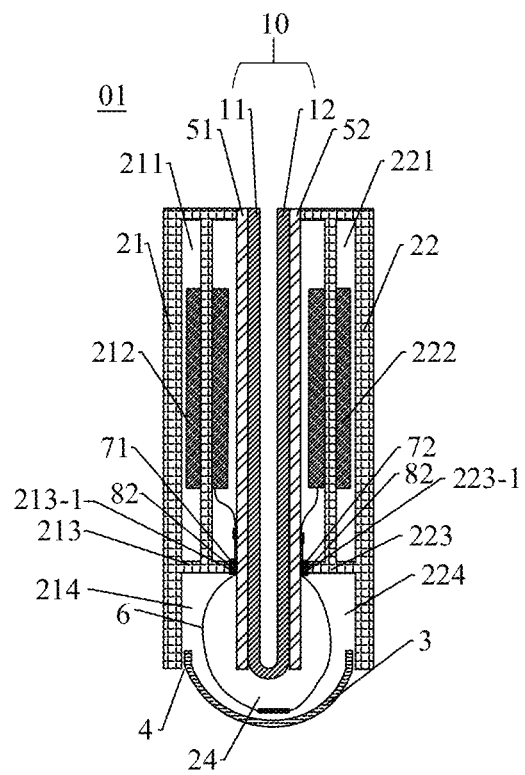
FIG. 6 is a cross-sectional view of the foldable electronic device shown in FIG. 4.

FIG. 5 is a cross-sectional view obtained by cutting FIG. 3. FIG. 6 is a cross-sectional view obtained by cutting FIG. 4. It should be understood that, because FIG. 3 shows the unfolded state of the foldable electronic device 01, FIG. 5 also shows the unfolded state. Because FIG. 4 shows the folded state of the foldable electronic device 01, FIG. 6 also shows the folded state.

As shown in FIG. 5 and FIG. 6, the first shell component 21 is configured to support the first screen 11, and the second shell component 22 is configured to support the second screen 12.

Optionally, to form a stable support for the foldable screen 10, a first support plate 51 may be arranged above the first shell component 21, to support the first screen 11. A second support plate 52 may be arranged above the second shell component 22, to carry the second screen 12.

It should be understood that, in other embodiments, the foldable screen 10 itself can also be integrated with a support plate, or the foldable screen 10 itself is rigid and does not need to be supported by a support plate, or the first shell component 21 and the second shell component 22 themselves also include support plates that can support the foldable screen 10. In this case, a separate support plate may not be arranged in the foldable electronic device 01, and instead, the foldable screen 10 is directly supported by the first shell component 21 and the second shell component 22, which is not specifically limited in this embodiment of this application.

The first compartment 211 is formed in the first shell component 21, and the second compartment 221 is formed in the second shell component 22. Components that are not related to implementation of a folding function in opening and closing processes can be arranged in the first compartment 211 and the second compartment 221, but this application is not limited thereto. Exemplarily, the first compartment 211 is configured for arranging a first electronic module 212 that implements a signal processing function, and the second compartment 221 is configured for arranging a second electronic module 222 that implements a signal processing function.

To implement the folding function, a movable region 24 is further formed between the first shell component 21 and the second shell component 22, and the movable region 24 is located between the first compartment 211 and the second compartment 221 in the unfolded state shown in FIG. 5. Related components of which own states need to be changed during the opening and closing to implement the folding function in cooperation, for example, the rotary shaft component 3, may be arranged in an interior of the movable region 24, but this application is not limited thereto.

In addition, a deformable FPC 6 is further arranged in the movable region 24, to couple the first electronic module 212 and the second electronic module 222, thereby implementing signal transmission. Relative positions of the first compartment 211 at which the first electronic module 212 is located and the second compartment 221 at which the second electronic module 222 is located change with the opening and closing of the foldable electronic device 01, that is, the first compartment 211 and the second compartment 221 are not always located at the same horizontal position. If a common PCB is used for coupling, because the PCB cannot be bent and hinders folding, in this example, the FPC 6 is used for replacing the PCB, to couple the first electronic module 212 and the second electronic module 222. In this way, the FPC 6 can perform a bending motion by using its flexibility within the movable region 24 to cooperate with the folding, so as to avoid hindering the folding during the opening and closing of the foldable electronic device 01.

Still referring to FIG. 5 and FIG. 6, to couple the first electronic module 212 and the second electronic module 222 located in different compartments by using the FPC 6 in the movable region 24, the first compartment 211 and the movable region 24 are in communication with each other through the first through hole 71, and the second compartment 221 and the movable region 24 are in communication with each other through the second through hole 72. A first end of the FPC 6 passes through the first through hole 71 to be coupled to the first electronic module 212, and a second end of the FPC 6 passes through the second through hole 72 to be coupled to the second electronic module 222, thereby achieving signal transmission between the first electronic module 212 and the second electronic module 222. In this way, during the opening and closing of the foldable electronic device 01, the FPC 6 can perform a bending motion by using its flexibility, to assist in implementing the opening and closing function. It can be seen by comparing FIG. 5 and FIG. 6 that, to assist in implementing the opening and closing function, when the FPC 6 changes from the folded state shown in FIG. 6 to the unfolded state shown in FIG. 5, a degree of bending becomes significantly larger.

Figure 7:
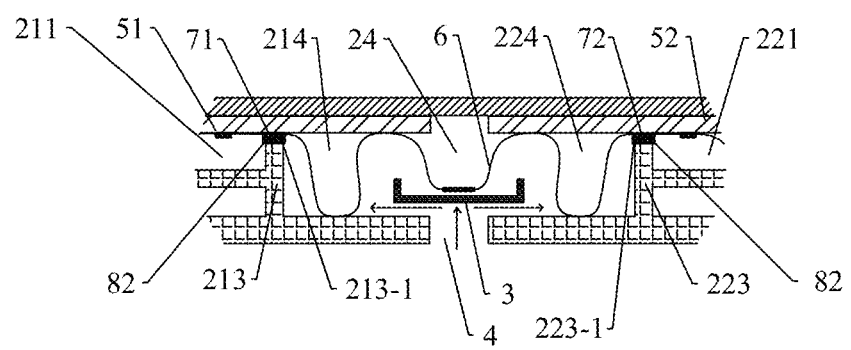
FIG. 7 is a partial enlarged view of a region A in FIG. 5.

With reference with FIG. 5 and FIG. 6, referring to FIG. 7, in some embodiments of this application, to form the foregoing three spaces, the first shell component 21 includes a first side wall 213, and the first shell component 21 is connected to the first support plate 51 by the first side wall 213, so as to support the first support plate 51. The second shell component 22 includes a second side wall 223, and the second shell component 22 is connected to the second support plate 52 by the second side wall 223, so as to support the second support plate 52. It should be understood that, to achieve supporting, connection modes between the first side wall 213 and the first support plate 51, and the second side wall 223 and the second support plate 52 may be abutting, welding, or the like. This is not specifically limited in the embodiments of this application.

The first side wall 213 divides an interior of the first shell component 21 into the first compartment 211 and a first movable region 214. The second side wall 223 divides the second shell component 22 into the second compartment 221 and a second movable region 224. The first movable region 214, the second movable region 224, and a gap 4 between the first shell component 21 and the second shell component 22 form the movable region 24, so that three spaces in the unfolded state shown in FIG. 5 can be obtained, which respectively are: the first compartment 211, the second compartment 221, and the movable region 24 located between the first compartment 211 and the second compartment 221.

A first through hole 71 running through the first compartment 211 and the first movable region 214 is formed between a support end 213-1 of the foregoing first side wall 213 and the first support plate 51, and a second through hole 72 running through the second compartment 221 and the second movable region 224 is formed between a support end 223-1 of the foregoing second side wall 223 and the second support plate 52. It should be noted that, in the foldable electronic device 01 shown in FIG. 5, when the first shell component 21 is assembled, a specific space can be maintained between the support end 213-1 of the first side wall 213 and the first support plate 51, to obtain the first through hole 71, and the second through hole 72 can be obtained in the same way. In this way, a process step of opening the first through hole 71 can be omitted.

It should be understood that FIG. 5 is only a schematic representation of the foregoing three regions, and in other embodiments of this application, the foregoing three regions may also be formed by other structures. In addition, to couple the first electronic module 212 and the second electronic module 222 by using the FPC 6, the first through hole 71 for the FPC 6 to pass through may further be on the first side wall 213, and the second through hole 72 for the FPC 6 to pass through may further be on the second side wall 223, which is not specifically limited in this application. It is further be understood that, when the foregoing support plate is not arranged in the foldable electronic device 01, relationship between components in FIG. 5 and the first support plate 51 and the second support plate 51 should be understood as relationships with the first screen 11 and the second screen 12. For example, a first through hole 71 is formed between the support end 213-1 of the first side wall 213 and the first screen 11.

To prevent external liquid from intruding into the foldable electronic device 01 through the gap 4 and damaging electronic components in the foldable electronic device 01, in this embodiment, a magnetic colloidal structure 82 is arranged in the first through hole 71 and the second through hole 72, so as to obtain the foldable electronic device 01 having a waterproof function shown in FIG. 5 and FIG. 6.

The magnetic colloidal structure 82 refers to an elastomer structure that can magnetically attract the first shell component 21 and the second shell component 22. Such an elastomer structure has a magnetic property due to an addition of a magnetic substance, such as magnetic powder. Exemplarily, the magnetic colloidal structure 82 may be any one of a magnetic rubber, a magnetic epoxy glue, or a magnetic acrylic glue. In addition, because the first through hole 71 and the second through hole 72 are provided not only for arranging the magnetic colloidal structure 82, but also for the FPC 6 to pass through, the foregoing "matching magnetic colloidal structure 82" refers to that the magnetic colloidal structure 82 matches the first through hole 71 and the second through hole 72 in shape and size while ensuring the FPC 6 can pass, so as to seal the first through hole 71 and the second through hole 72.

In the foldable electronic device 01 shown in FIG. 5 to FIG. 7, the magnetic colloidal structure 82 can be attracted into the first through hole 71 and the second through hole 72 by using its own magnetic property, to be fixedly connected to the first through hole 71 and the second through hole 72. Because the magnetic colloidal structure 82 matches the first through hole 71 and the second through hole 72 in shape and size, the magnetic colloidal structure 82 can seal the first through hole 71 and the second through hole 72, thereby blocking liquid intrusion paths from the movable region 24 to the first compartment 211 and the second compartment 221 respectively. In this way, it is difficult for external liquid intruding into the movable region 24 through the gap 4 to intrude into the first compartment 211 and the second compartment 221, thereby reducing a risk that liquid intrudes into the foldable electronic device 01, and avoiding damage to a screen and an internal electronic component.

In addition, compared with the solution of mounting the sealing ring or the sealing foam 81 in FIG. 2, in the foldable electronic device 01 shown in FIG. 5 to FIG. 7, the magnetic colloidal structure 82 is fixed by using a magnetic property, and can be peeled off and then repositioned when it is not assembled in place until it is mounted in place. When assembling is performed in a narrow operating space, the magnetic colloidal structure 82 can be pre-positioned by using magnetic attraction, and then be finely adjusted in place, which is easy to operate in a narrow space, and resolves the technical problem that it is difficult to operate in the narrow space. In addition, the magnetic colloidal structure 82 is slightly harder than the sealing ring or the sealing foam 81 which has a softer texture, and is not easily wrinkled during assembly.

In some embodiments of this application, to arrange the magnetic colloidal structure 82 in the first through hole 71 and the second through hole 72 for a sealing connection, the magnetic colloidal structure 82 may also be directly and fixedly arranged in the first through hole 71 and the second through hole 72 by using its magnetic property while keeping a gap for the FPC 6 to pass through. Exemplarily, the magnetic colloidal structure 82 may be arranged close to a side of the through hole while keeping a gap with an other side of the through hole. The magnetic colloidal structure 82 may also be arranged around the through hole, and a gap is provided on the magnetic colloidal structure 82, which is not specifically limited in this embodiment of this application.

In this case, after the first end of the FPC 6 can pass through the gap in the first through hole 71 to be coupled to the first electronic module 212, and the second end of the FPC 6 can pass through the gap in the second through hole 72 to be coupled to the second electronic module 222, a wall of the gap tightly wraps the FPC 6, and the gap no longer exists. In addition, the magnetic colloidal structure 82 seals other spaces in the first through hole 71 and the second through hole 72 than the FPC 6, to produce a sealing effect.

Figure 8:
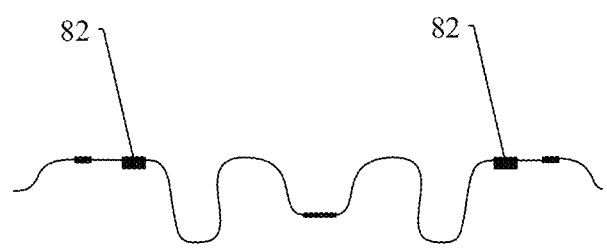
FIG. 8 is a schematic structural diagram of an FPC according to an embodiment of this application.

With reference to FIG. 7, as shown in FIG. 8, in other embodiments of this application, the magnetic colloidal structure 82 may be formed at a position at which the FPC 6 is located in the first through hole 71 and the second through hole 72 through a process such as injection molding, causing the magnetic colloidal structure 82 to be fixedly sleeved on the FPC 6. During the assembly, when the FPC 6 passes through the first through hole 71 and the second through hole 72 to be respectively coupled to the first electronic module 212 and the second electronic module 222, the FPC 6 directly brings the magnetic colloidal structure 82 into the first through hole 71 and the second through hole 72, thereby implementing the arrangement of the magnetic colloidal structure 82. In this case, the magnetic colloidal structure 82 can be fixedly connected into the first through hole 71 and the second through hole 72 by using its own magnetic property, so as to produce sealing and connecting effects.

In this way, the magnetic colloidal structure 82 is fixedly sleeved on the FPC 6 through a process such as injection molding, so that the magnetic colloidal structure 82 and the FPC 6 can form a tight and seamless connection relationship, and the magnetic colloidal structure 82 can better seal the foregoing through holes (for example, the first through hole 71 and the second through hole 72). In addition, by such configuration, during assembling the FPC 6, the magnetic colloidal structure 82 is directly brought into the first through hole 71 and the second through hole 72, and there is no need to separately mount the magnetic colloidal structure 82, making the mounting process simpler.

As shown in FIG. 7, to form better sealing and connection effects between the magnetic colloidal structure 82 and the through hole, in some embodiments of this application, the support end 213-1 of the first side wall 213 and the support end 223-1 of the second side wall 223 (not shown in the figure) are both provided with a groove, and the magnetic colloidal structure 82 is embedded in the groove. In this way, when the magnetic colloidal structure 82 is located in the groove, the groove and the magnetic colloidal structure 82 are magnetically attracted to each other more closely on three surfaces of the groove. In addition, the groove can tightly wrap and lock the magnetic colloidal structure 82, so that tighter contact and sealing can be formed.

As shown in FIG. 7, to avoid displacement of the FPC 6 during the opening and closing of the foldable electronic device 01, some fixed blocks (black blocks other than the magnetic colloidal structure 82 in FIG. 7) are further arranged on the FPC 6, the FPC 6 can be fixed in the foldable electronic device 01 by using the fixed blocks, so as to avoid displacement. It should be understood that the FPC 6 can bend and move in an unfixed region, to assist in the folding function.

A liquid intrusion process of external liquid is described below in detail by using a scenario in which the electronic device is an earphone.

Figure 9:
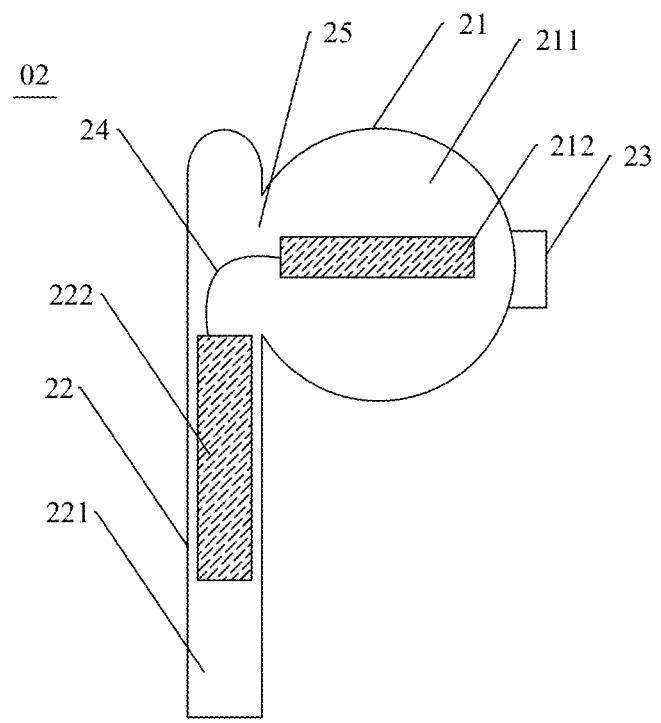
FIG. 9 is a schematic diagram of an internal structure of an earphone.

Exemplarily, FIG. 9 is a schematic structural diagram of an earphone according to an embodiment of this application. The earphone 02 may be a wireless Bluetooth earphone, a wired earphone, or the like, which is not specifically limited in this embodiment of this application.

As shown in FIG. 9, the earphone 02 includes an earphone head shell 21 and an earphone stem shell 22.

A first compartment 211 is formed in the earphone head shell 21, and a first electronic module 212 configured to implement audio output is arranged in the first compartment 211. It should be understood that, to implement audio output, a sound outlet hole 23 is further provided on the earphone head shell 21. A second compartment 221 is formed in the stem shell 22 of the earphone 02, and a second electronic module 222 configured to supply power to the first electronic module 212 is arranged in the second compartment 221.

The foregoing first electronic module 212 is coupled to the second electronic module 222, so that the second electronic module 222 supplies power to the first electronic module 212. Because the first compartment 211 in which the first electronic module 212 is located and the second compartment 221 in which the second electronic module 222 is located are not at the same horizontal position, the first electronic module 212 and the second electronic module 222 may be coupled by using the FPC 24 that is flexible. In this way, the FPC 24 can be bent by using its flexibility, to match spatial arrangement of the first electronic module 212 and the second electronic module 222.

To couple the first electronic module 212 and the second electronic module 222 located in different compartments by using the FPC 24, the first compartment 211 and the second compartment 221 are in communication with each other through a through hole 25 for the FPC 24 to pass through. The first electronic module 212 is coupled to the second electronic module 222 by using the FPC 24 passing through the through hole 25, so that the second electronic module 222 supplies power to the first electronic module 212.

It can be seen from the above that, when there is an opening on the shell of the earphone 02, such as the sound outlet hole 23 on the earphone head shell 21, external liquid may intrude into the earphone 02 through the opening, and then intrude into the second compartment 221 through the through hole 25, resulting in damage to the earphone 02.

Figure 10:
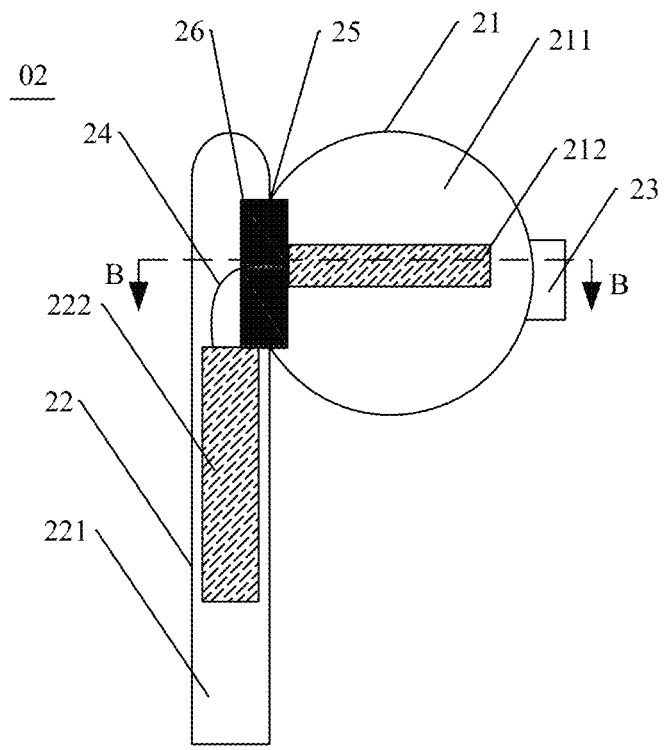
FIG. 10 is a schematic diagram of an internal structure of an earphone according to an embodiment of this application.
Figure 11:
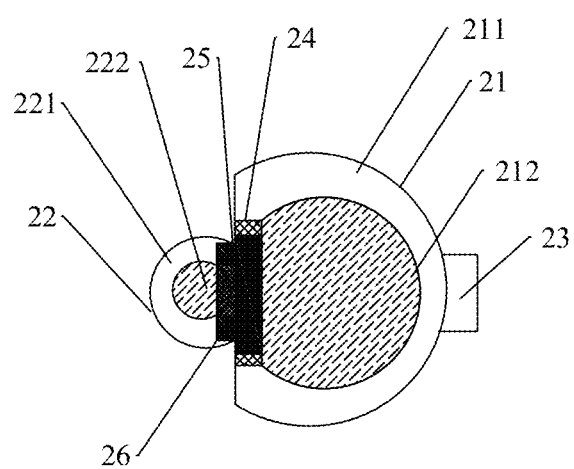
FIG. 11 is a cross-sectional view obtained by cutting along B-B in FIG. 10.

To resolve the technical problem that external liquid intrudes into the earphone 02 through the opening on the shell of the earphone 02 and causes damage to the earphone 02, in the embodiments of this application, a matching magnetic colloidal structure 26 is arranged in the through hole 25 shown in FIG. 9, and further, the earphone 02 shown in FIG. 10 and FIG. 11 is obtained.

For a specific implementation of the magnetic colloidal structure 26, reference may be made to the implementation in the foldable electronic device 01 shown in FIG. 5, which is not described herein again.

In the earphone 02 shown in FIG. 10, the magnetic colloidal structure 26 can be fixedly connected into the through hole 25 by using its own magnetic property and viscosity, to seal the through hole 25, thereby blocking a liquid intrusion path between the first compartment 211 and the second compartment 221. In this way, it is difficult for external liquid intruding into the first compartment 211 through the opening to intrude into the second compartment 221 and further cause damage to the second electronic module 222, thereby reducing a risk of damage to the earphone 02.

The foregoing descriptions are merely specific implementations of the embodiments of this application, but the protection scope of the embodiments of this application is not limited thereto. Any variation or replacement within the technical scope disclosed in the embodiments of this application shall fall within the protection scope of the embodiments of this application. Therefore, the protection scope of the embodiments of this application shall be subject to the protection scope of the claims.

What is claimed is:

1. A waterproof electronic device, comprising: a shell, a first electronic module, a second electronic module, and a flexible printed circuit FPC, wherein the shell comprises a first compartment and a second compartment; the first compartment and the second compartment are in communication with each other through a through hole, and the through hole is used for the FPC to pass through;

the first electronic module is arranged in the first compartment, and the second electronic module is arranged in the second compartment; the first electronic module is coupled to the second electronic module by using the FPC, and the FPC passes through the through hole; and an opening is provided on the shell, wherein the opening is in communication with the through hole, and a magnetic colloidal structure is arranged in the through hole, wherein the magnetic colloidal structure matches the through hole.

2. The waterproof electronic device according to claim 1, wherein the magnetic colloidal structure is fixedly sleeved on the FPC; and when the FPC passes through the through hole to be respectively coupled to the first electronic module and the second electronic module, the magnetic colloidal structure is located in the through hole.

3. The waterproof electronic device according to claim 1, wherein the waterproof electronic device is a foldable electronic device; the foldable electronic device further comprises a rotary shaft component;

the shell comprises a first shell component and a second shell component; the first shell component and the second shell component are respectively connected to the rotary shaft component, and the first shell component and the second shell component rotate under the driving of the rotary shaft component, causing the foldable electronic device to be folded or unfolded;

the first compartment is formed in the first shell component, and the second compartment is formed in the second shell component; a movable region is formed between the first shell component and the second shell component, and the movable region is located between the first compartment and the second compartment when the foldable electronic device is in an unfolded state; the rotary shaft component and the FPC are arranged in the movable region;

the through hole comprises a first through hole running through the movable region and the first compartment, and a second through hole running through the movable region and the second compartment; a first end of the FPC passes through the first through hole to be coupled to the first electronic module, and a second end of the FPC passes through the second through hole to be coupled to the second electronic module; and the matching magnetic colloidal structures is arranged in both the first through hole and the second through hole.

4. The waterproof electronic device according to claim 3, wherein the foldable electronic device further comprises a first support plate, a second support plate, and a foldable screen; the foldable screen is foldable to form a first screen and a second screen;

the first support plate is configured to carry the first screen, and the second support plate is configured to carry the second screen;

the first shell component comprises a first side wall configured to support the first support plate, and the second shell component comprises a second side wall configured to support the second support plate; and the first side wall divides an interior of the first shell component into the first compartment and a first movable region, the second side wall divides the second shell component into the second compartment and a second movable region, and the first movable region and the second movable region are located within the movable region.

5. The waterproof electronic device according to claim 4, wherein a support end of the first side wall is connected to the first support plate, and the first through hole is formed between the support end of the first side wall and the first support plate; and a support end of the second side wall is connected to the second support plate, and the second through hole is formed between the support end of the second side wall and the second support plate.

6. The waterproof electronic device according to claim 5, wherein the support end of the first side wall and the support end of the second side wall are both provided with a groove, and the magnetic colloidal structure is embedded into the groove.

7. The waterproof electronic device according to claim 4, wherein when the foldable electronic device is in the unfolded state, the opening is a gap formed by the shell between the first shell component and the second shell component.

8. The waterproof electronic device according to claim 1, wherein the waterproof electronic device is an earphone, and the shell comprises an earphone head shell and an earphone stem shell, wherein the first compartment is formed in the earphone head shell, and the second compartment is formed in the earphone stem shell; and the first electronic module is configured to implement audio output, and the second electronic module is configured to supply power to the first electronic module by using the FPC passing through the through hole.

9. The waterproof electronic device according to claim 8, wherein the opening is a sound outlet hole on the earphone head shell.

10. The waterproof electronic device according to claim 1, wherein the magnetic colloidal structure comprises any one of a magnetic rubber, a magnetic epoxy glue, or a magnetic acrylic glue.

* * * * *